US005952620A

United States Patent [19]

Hamilton et al.

[11] Patent Number: 5,952,620

[45] Date of Patent: Sep. 14, 1999

[54] OMNI-DIRECTIONAL SUB-BASS LOUDSPEAKER

[75] Inventors: Peter A. Hamilton, Greenwich; Mikhail Malkovitch, Stamford, both of Conn.

[73] Assignee: Sonic Systems, Inc., Stamford, Conn.

[21] Appl. No.: 08/954,948

[22] Filed: Oct. 22, 1997

[51] Int. Cl.[6] .......................... H05K 5/00

[52] U.S. Cl. .......................... 181/153; 181/156

[58] Field of Search .......................... 181/144, 145, 181/152, 153, 156, 155, 199; 381/90, 154, 159, 202, 205, 188

[56] References Cited

U.S. PATENT DOCUMENTS

| | | | |
|---|---|---|---|
| 3,812,301 | 5/1974 | Lahti | 181/153 |
| 4,219,099 | 8/1980 | Sacks | 181/153 |
| 4,466,505 | 8/1984 | Ritter | 181/144 |
| 5,701,358 | 12/1997 | Larsen | 381/202 |

*Primary Examiner*—Khanh Dang

*Attorney, Agent, or Firm*—St. Onge Steward Johnston & Reens LLC

[57] ABSTRACT

A loudspeaker including a generally spherical cabinet and at least one speaker driver contained in the cabinet and dividing the cabinet into a major sound chamber and a minor sound chamber. The cabinet has at least two sound propagation ports communicating with the major sound chamber and at least two sound propagation ports communicating with the minor sound chamber. The spherical cabinet of the loudspeaker provides an omni-directional radiation pattern. According to one possible embodiment, the at least one speaker driver comprises two speaker drivers facing each other and connected out of electronic phase so as to operate as a single push-pull unit. The loudspeaker, therefore, utilizes the rear sound waves created by its speaker drivers. One of the speaker drivers is substantially contained in the minor sound chamber and the other of the speaker drivers is substantially contained in the major sound chamber. According to another possible embodiment, the loudspeaker further includes at least one support assembly extending through the cabinet and linking opposing hanging points on the outside of the cabinet. The loudspeaker, accordingly, can be hung from above and support weight hung below without requiring that the cabinet itself bear the weight.

19 Claims, 4 Drawing Sheets

OMNI-DIRECTIONAL SUB-BASS LOUDSPEAKER

FIELD OF THE INVENTION

The present invention relates to high fidelity voice or music reproduction systems, and in particular to loudspeakers for broadcasting announcements, music, etc. in large open or enclosed areas. Even more particularly, the present invention relates to an omni-directional sub-bass loudspeaker.

BACKGROUND OF THE INVENTION

In the field of high fidelity voice or music reproduction systems, and in particular loudspeakers, substantial and continuous efforts are being made to obtain sound reproduction which is as faithful as possible to the original sounds to be reproduced by the loudspeaker. The problem is most acute for lower frequency sounds, otherwise known as bass sounds, and most loudspeakers fail to faithfully reproduce such bass sounds. Many loudspeakers include at least one speaker driver contained in a cabinet, which may or may not be used to help direct sound waves from the speaker driver. The inherent resonance frequency of the speaker driver and the cabinet function to produce "booming" or unnatural emphasis of base tones of particular frequencies, while de-emphasizing other frequencies, thereby distorting announcements or music broadcast over the loudspeaker.

Sound distortions created by loudspeakers, however, are most particularly acute in large open or enclosed areas such as, for example, stadiums, arenas, airports, train stations, theaters, ice rinks or the like. Most loudspeakers produce sound in only one direction and, therefore, must be aimed towards the audience for all frequencies to be heard. Often, even in areas with good acoustic qualities, dead spots, where sound reproduction is soft or unintelligible, and hot spots, where sound reproduction is uncomfortably high, are created by the loudspeaker. In addition, with most loudspeakers it is often difficult to project sound to persons furthest from the loudspeakers without making it uncomfortably loud for persons nearest the speaker. What would be best is a loudspeaker that provides an omni-directional radiation pattern that decreases or eliminates the creation of dead and hot spots when broadcasting in large open or enclosed areas.

In general, nearly all speaker drivers reproduce sounds with a vibrating diaphragm. As the diaphragm vibrates, sound waves are propagated both in front of and behind the speaker driver. The sound waves on opposite sides of the speaker driver are 180° out of phase and provision must be made to prevent the sound waves from canceling each other out. Normally, this is accomplished by mounting the speaker driver in an appropriate enclosure or cabinet, which is employed to contain or dissipate the "rear" sound wave and permit free radiation of the "front" sound wave. Alternatively, the rear sound wave is useful only if it is in phase or augments the front sound wave. What would be best is a loudspeaker that is adapted to harness the rear sound wave in addition to providing omni-directional radiation.

What is desired, therefore, is a loudspeaker that provides omni-directional radiation, especially with low frequencies, that decreases or eliminates the creation of dead and hot spots when broadcasting in large open or enclosed areas. Preferably, the loudspeaker will utilize the rear sound waves created by its speaker drivers. In addition, the loudspeaker should have a rigid and durable, yet light-weight cabinet, and still be able to be hung from above and support weight hung below.

SUMMARY OF THE INVENTION

An object, therefore, of the present invention is to provide a loudspeaker that provides an omni-directional radiation pattern, especially with low frequencies, that decreases or eliminates the creation of dead and hot spots when broadcasting in large open or enclosed areas.

Another object of the present invention is to provide a loudspeaker that utilizes the rear sound waves created by its speaker drivers.

An additional object of the present invention is to provide a loudspeaker having a rigid and durable, yet light-weight cabinet which can be hung from above and support weight hung below.

These and other objects of the present invention are achieved by a loudspeaker including a generally spherical cabinet and at least one speaker driver contained in the cabinet and dividing the cabinet into a major sound chamber and a minor sound chamber. The cabinet has at least two sound propagation ports communicating with the major sound chamber and at least two sound propagation ports communicating with the minor sound chamber. The spherical cabinet of the loudspeaker provides an omni-directional radiation pattern, while the two sound chambers allow the loudspeaker to utilize both the front and the rear sound waves of the at least one speaker driver.

According to one aspect of the present invention, the at least one speaker driver comprises two speaker drivers facing each other and connected out of electronic phase so as to operate as a single push-pull unit. The loudspeaker, therefore, is able to further utilize the rear sound waves created by its speaker drivers. One of the speaker drivers is substantially contained in the minor sound chamber and the other of the speaker drivers is substantially contained in the major sound chamber.

According to another aspect of the present invention, the loudspeaker further includes at least one support assembly extending through the cabinet and linking opposing hanging points on the outside of the cabinet. The loudspeaker, accordingly, can be hung from above and support weight hung below without requiring that the cabinet itself bear the weight.

The invention and its particular features and advantages will become more apparent from the following detailed description considered with reference to the accompanying drawings.

DETAILED DESCRIPTION OF THE INVENTION

Figure 1:
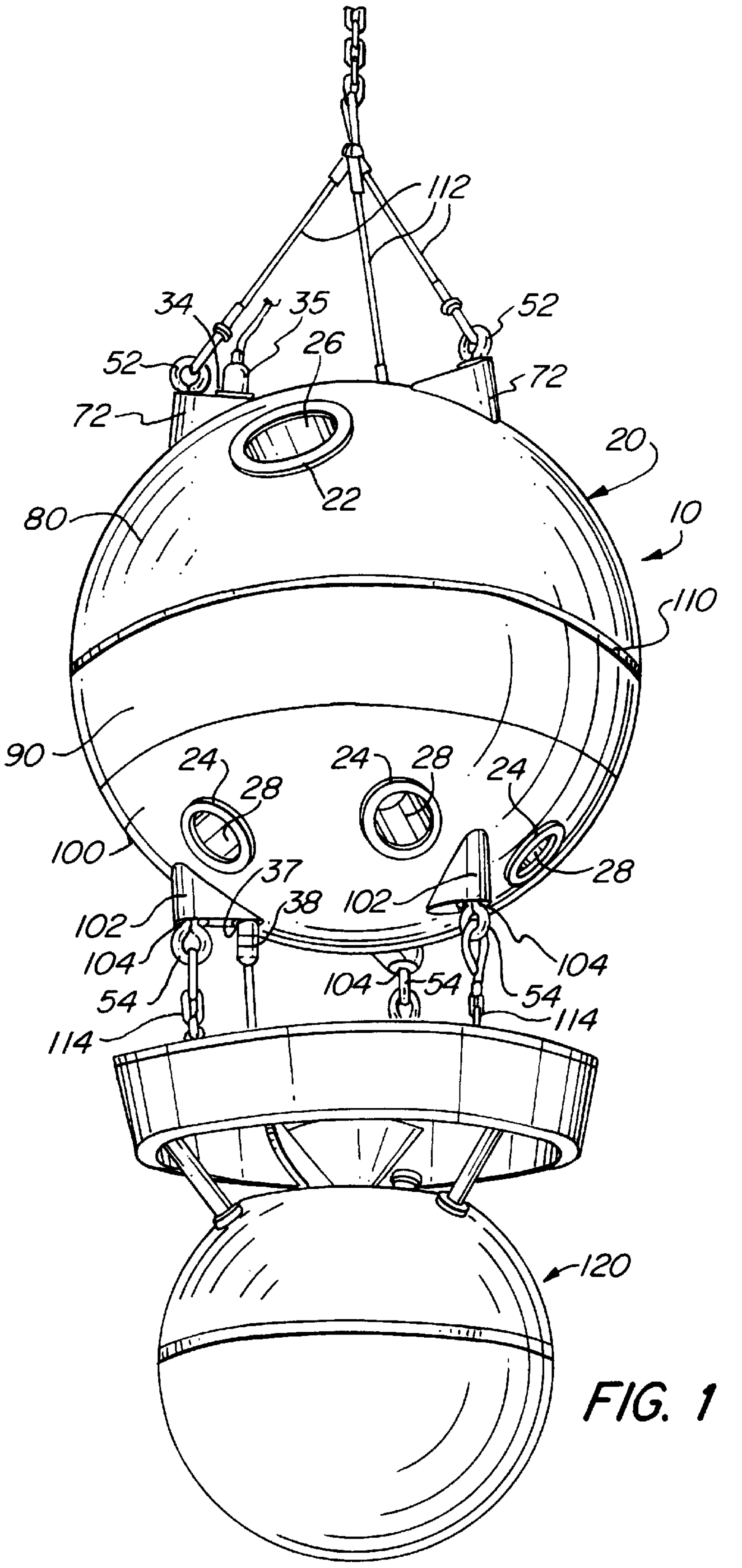
FIG. 1 is a front isometric view of an omni-directional sub-bass loudspeaker according to the present invention illustrated with a hemispherically wide-radiating-angle loudspeaker hanging therefrom.

Referring to FIGS. 1–6, the present invention provides an omni-directional sub-bass loudspeaker 10. The loudspeaker 10 includes a generally spherical cabinet 20 and at least one speaker driver contained in the cabinet and dividing the cabinet into a major sound chamber 40 and a minor sound chamber 42 (although the loudspeaker is shown with two speaker drivers 30,32, the loudspeaker could be provided with only one speaker driver—either 30 or 32). As their names imply, the major sound chamber 40 is of greater volume than the minor sound chamber 42. The cabinet 20 has at least two sound propagation ports 22 communicating with the major sound chamber 40 and at least two sound propagation ports 24 communicating with the minor sound chamber 42. The spherical cabinet 20 of the loudspeaker 10 provides an omni-directional frequency response, while the two sound chambers 40, 42 allow the loudspeaker to utilize both the front and rear sound waves of the at least one speaker driver.

The loudspeaker 10, however, preferably includes a first speaker driver 30 and a second speaker driver 32, with the two speaker drivers mounted facing each other and connected out of electronic phase so as to operate as a single push-pull unit. This increases the loudspeaker sensitivity and power handling, and permits reducing the driving impedance. Because the speaker drivers 30,32 are configured as a push-pull unit, the loudspeaker 10 is able to further utilize the rear sound waves created by the speaker drivers. The first speaker driver 30 is substantially contained in the major sound chamber 40, while the second speaker driver 32 is substantially contained in the minor sound chamber 42.

The loudspeaker 10 also preferably includes at least one support assembly 50 extending through the cabinet 20 and linking opposing hanging points on the outside of the cabinet. The loudspeaker 10, accordingly, can be hung from above and support weight hung below without requiring that the cabinet 20 itself bear the weight.

In general, for best sound reproduction it has been found that a ratio of the volume of the major sound chamber 40 to the volume of the minor sound chamber 42 should be between about 2:1 to about 4:1, and preferably between about 2.6:1 to about 3.5:1.

In addition, the cabinet 20 should have at least three sound propagation ports 22 communicating with the major sound chamber 40 and at least three sound propagation ports 24 communicating with the minor sound chamber 42, with the three sound propagation ports of each sound chamber equally spaced apart to provide output every one hundred and twenty degrees. Also, the number of sound propagation ports 24 communicating with the minor sound chamber 42 should be from about 1.5 to about 3 times the number of sound propagation ports 22 communicating with the major sound chamber 40. The sound propagation ports 22 communicating with the major sound chamber 40 should each have a diameter of between about 15.5% and about 22.5% of the diameter of the cabinet 20, and the sound propagation ports 24 communicating with the minor sound chamber 42 should each have a diameter of between about 8% and about 15% of the diameter of the cabinet.

Furthermore, the loudspeaker 10 preferably includes major tuned port tubes 26 positioned in the sound propagation ports 22 communicating with the major sound chamber 40, and minor tuned port tubes 28 positioned in the sound propagation ports communicating with the minor sound chamber 42. It has been found that the major tuned port tubes 26 should extend into the major sound chamber 40 a distance equal to between about 80% and about 120% of the diameter of the ports 22. In addition, the minor tuned port tubes 28 should extend into the minor sound chamber 42 a distance equal to between about 80% and about 70% of the diameter of the ports 24.

Front sound waves created by the first speaker driver 30 and rear sound waves created by the second speaker driver 32 are propagated through the major tuned port tubes 26. While front sound waves created by the second speaker driver 32 and rear sound waves created by the first speaker driver 30 are propagated through the minor tuned port tubes 28. In addition to utilizing both the front and the rear sound waves of the speaker drivers 30,32, the spherical cabinet 20 also acts as a natural acoustic filter for the speaker drivers and provides an omni-directional radiation pattern that decreases or eliminates the creation of dead and hot spots when the loudspeaker 10 is used in large open or enclosed areas.

Advantageously, in the most preferred embodiment, the spherical cabinet 20 is defined by three segments, a top segment 80, a middle segment 90 and a bottom segment 100. The top and the middle segments 80,90 cooperate with an annular plate 92 to form the major sound chamber 40, while the bottom segment 100 cooperates with the annular plate to form the minor sound chamber 42. Each segment is made of a suitably rigid and lightweight material, such as fiberglass polyester or high impact plastic for example.

The top segment 80 is in the shape of about half a hollow sphere, and has hollow fins 70 extending therefrom, with each fin having an upwardly facing mounting hole 104. The top segment 80 also includes the circular sound propagation ports 22, and fixed in each port is one of the major tuned port tubes 26. Preferably, the top segment 80 has three sound propagation ports 22, equally spaced apart, and three major tuned port tubes 26.

The middle segment 90 includes a sidewall 94 and the annular plate 92 extending inwardly from the bottom of the sidewall as a unitary piece. The annular plate 92, however, could alternatively be provided as a separate piece. The speaker drivers 30,32 are mounted on a bottom surface of the annular plate 92 using screws 66, for example, with the second driver 32 extending into the major sound chamber 40 and the first driver 30 extending into the minor sound chamber 42. The top segment 80 is sealingly joined to the top of the sidewall 94 of the middle segment 90 with fiberglass 111, for example, and a rubber gasket ring 110 is secured therebetween to provide a smooth exterior joinder.

The bottom segment 100 of the cabinet 20 is in the shape of less than half a hollow sphere, such that the shape of the three segments 80,90,100, when combined, approximates a sphere. The bottom segment 100 has hollow fins 102 extending therefrom, with each fin having a downwardly facing mounting hole 104. The bottom segment 100 also includes the circular sound propagation ports 24, and fixed in each port is one of the minor tuned port tubes 28. Preferably, the bottom segment 100 has six sound propagation ports 24, equally spaced apart, and six minor tuned port tubes 28. The bottom segment 100 additionally has an inwardly extending, annular, stepped flange 106 formed as a unitary piece with the bottom segment, and an annular gasket 108 is seated thereon. The stepped flange 106 could alternatively be provided as a separate piece. The annular plate 92 of the middle segment 90 sits on the stepped flange 106 of the bottom segment 100 with the annular gasket 108 therebetween. The loudspeaker 10 preferably includes a layer of fiberglass insulation 122 covering the interior of the bottom segment 100.

The three segments 80,90,100 of the spherical cabinet 20 are held together with the support assemblies 50, which extend from the hollow fins 72 of the top segment 80, through the annular plate 92 of the middle segment 90, and to the hollow fins 102 of the bottom segment 100. Preferably, the top segment 80 has three hollow fins 72, equally spaced apart, the bottom segment 100 has three hollow fins 72, equally spaced apart, and the loudspeaker 10 has three support assemblies 50 extending between the three hollow fins of the top segment and the three hollow fins of the bottom segment. Each support assembly 50 links opposing upper and lower hanging points 52;54 on the outside of the cabinet 20, which are preferably in the form of threaded eyebolts as shown. In addition to holding the cabinet 20 together, the support assemblies 50 allow the loudspeaker 10 to be hung from above and support a weight from below independently of the cabinet. The support assemblies 50, therefore, allow the cabinet 20 to be designed with less strength, reducing the overall weight, complexity and cost of the loudspeaker 10. In fact, it has been found that a loudspeaker 10 according to the present invention can be over 50% lighter than comparably sized existing loudspeakers. It should be noted, however, that in addition to being lightweight, the spherical cabinet 20 is also rigid and durable.

As shown in FIG. 1, the loudspeaker 10 is intended to be hung from a ceiling with, for example, cables 112 connected to the upper hanging points 52. In addition, a hemispherically wide-radiating-angle loudspeaker 120 (shown and disclosed in U.S. Pat. No. 5,268,538 to Queen) can be hung from below the sub-bass loudspeaker 10 with, for example, cables 66 connected to the lower hanging points 60.

Figure 6:
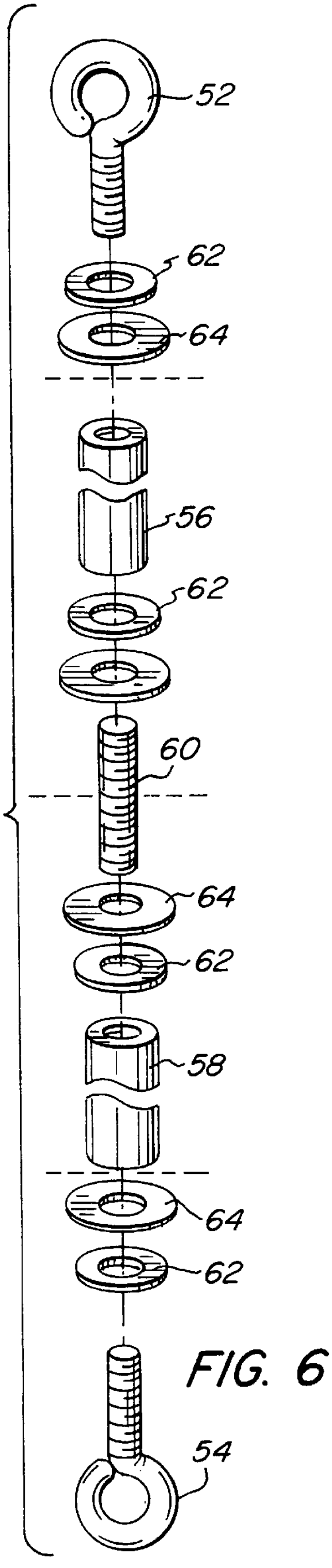
FIG. 6 is a front isometric exploded view of a support assembly of the omni-directional sub-bass loudspeaker of FIG. 1.
Figure 2:
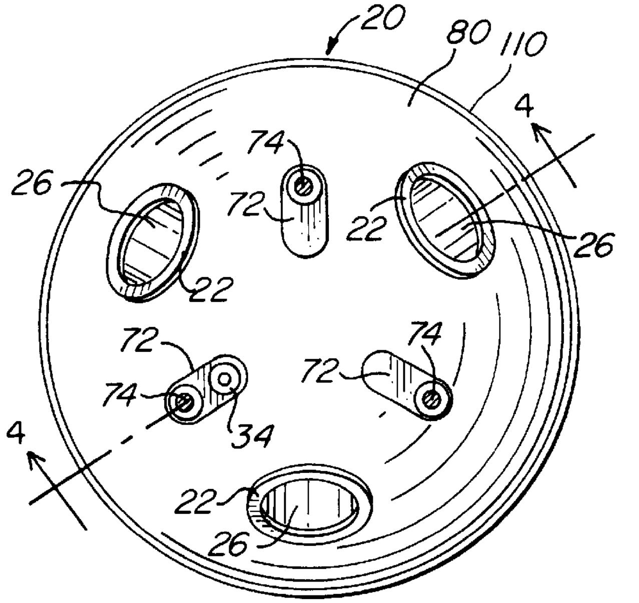
FIG. 2 is a top plan view of a cabinet of the omni-directional sub-bass loudspeaker of FIG. 1.
Figure 3:
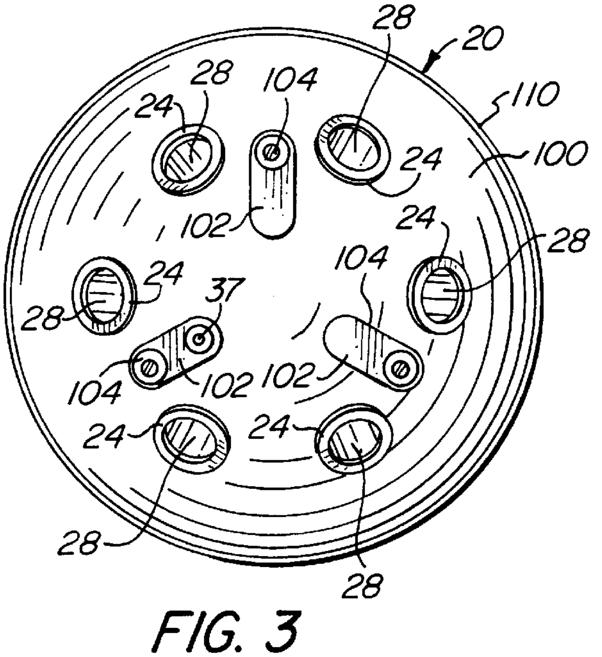
FIG. 3 is a bottom plan view of a cabinet of the omni-directional sub-bass loudspeaker of FIG. 1.
Figure 4:
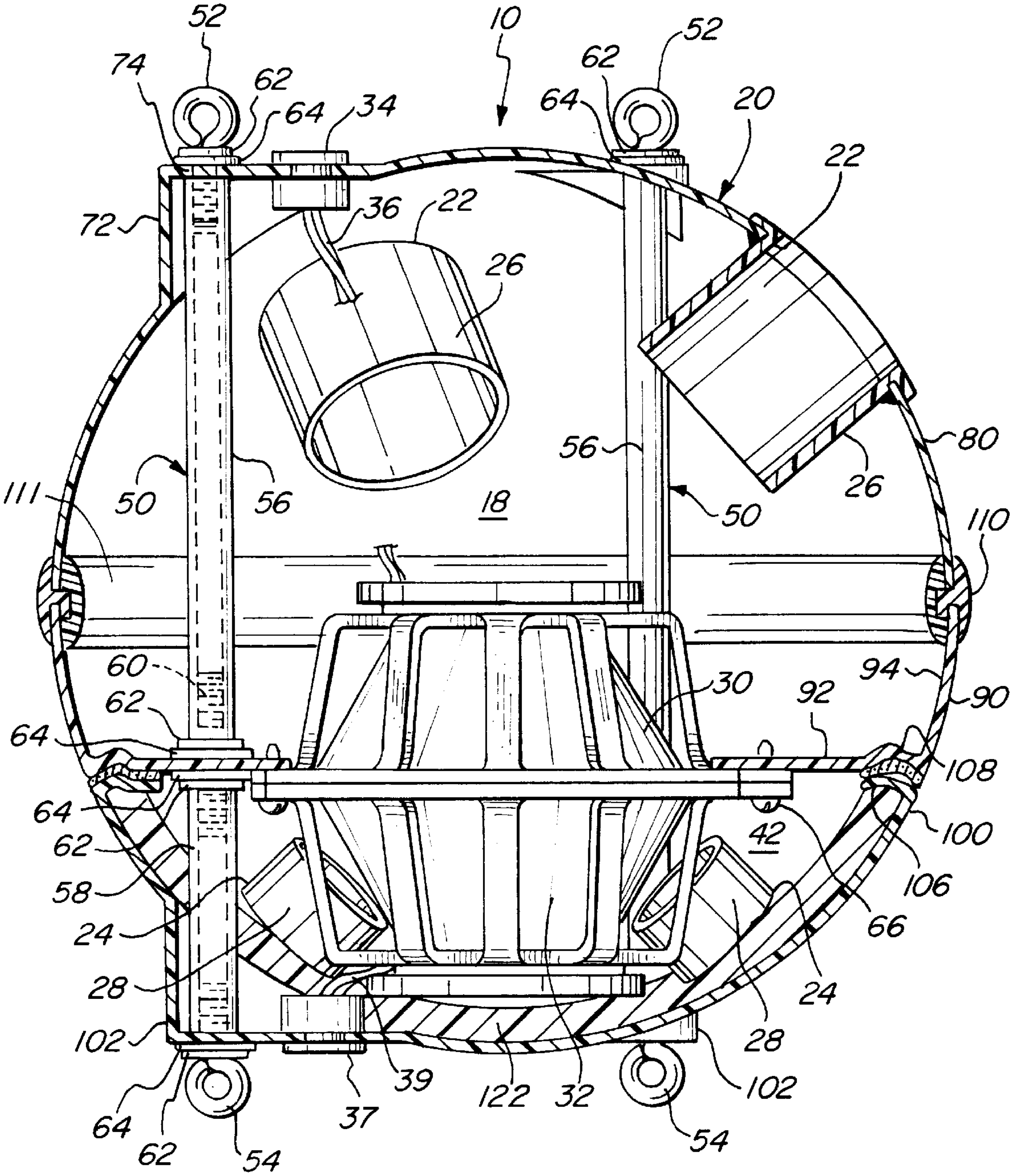
FIG. 4 is a front cross-sectional view of the omni-directional sub-bass loudspeaker of FIG. 1 taken along 4—4 in FIG. 2.
Figure 5:
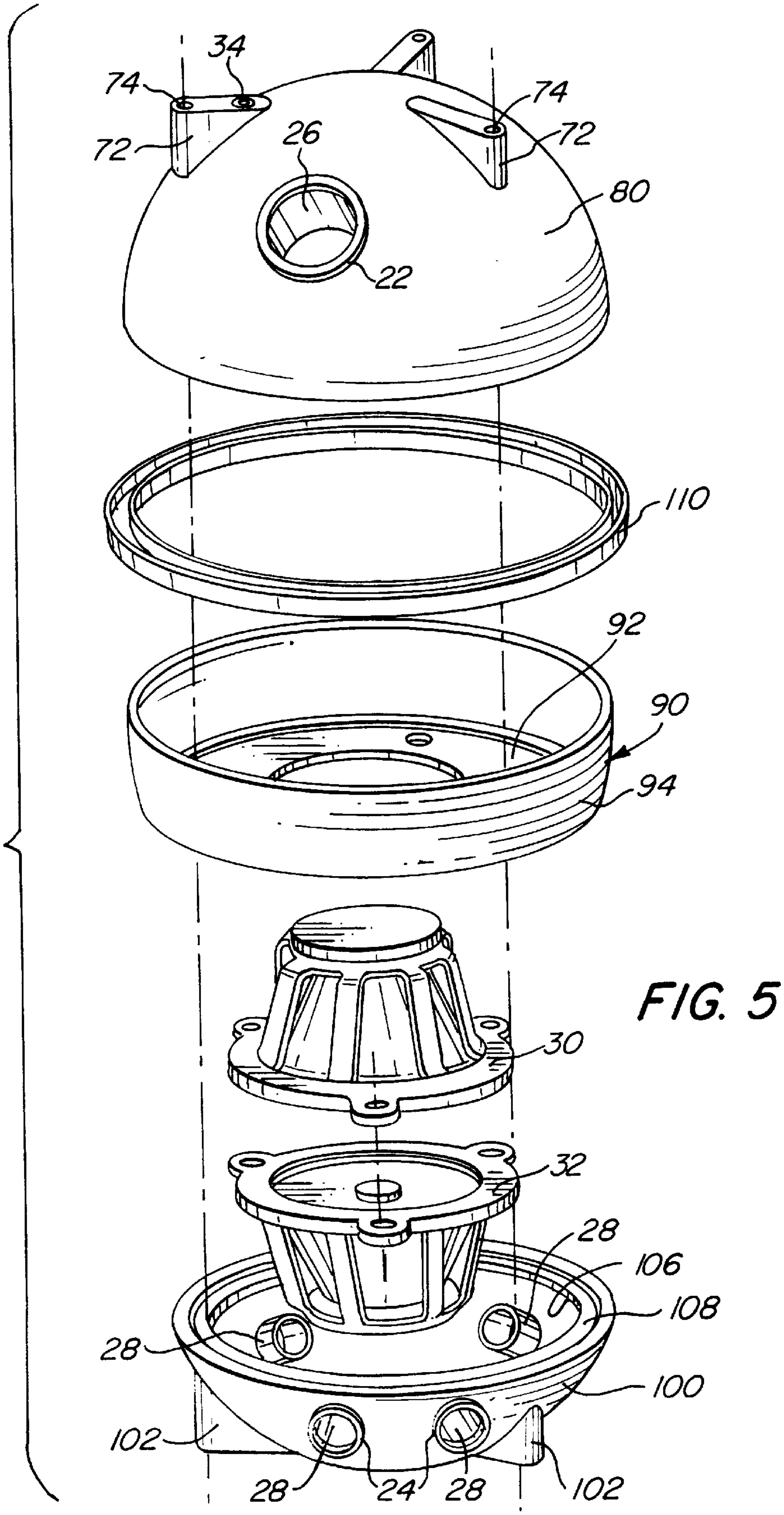
FIG. 5 is a front isometric exploded view of the cabinet and speaker drivers of the omni-directional sub-bass loudspeaker of FIG. 1.

As shown best in FIGS. 4 and 6, each support assembly 50 includes two threaded tubes 56,58, a threaded rod 60, four metal washers 62, and four rubber washers 64. One of the threaded tubes 56 extends between one of the fins 72 of the top segment 82 to the annular plate 92 of the middle segment 90, and the other threaded tube 58 extends from the annular plate to one of the fins 102 of the bottom segment 100. The threaded tubes 56,58 are secured together with the threaded rods 60, which extend through holes 68 in the annular plate 92. The upper hanging point 52 extends through the mounting hole 104 of the fin 102 of the top segment 80 and is threadedly secured in the threaded tube 56, while the lower hanging point 54 extends through the mounting hole 104 of the fin 102 of the bottom segment 100 and is threadedly secured in the threaded tube 58. The hanging points 52,54 and the threaded tubes 56,58 are separated from the cabinet 20 by the metal and rubber washers 62,64, with the rubber washers abutting and protecting the cabinet.

The loudspeaker 10 also includes an input plug 34, for connection to an input signal wire 35. Although its precise positioning is not critical, input plug 34 can be easily positioned in one of the fins 72 of the top segment 80 and connected to the speaker drivers 30,32 with a wire 36. An output plug 37, for connection to a signal wire 38 of the hemispherically wide-radiating-angle loudspeaker 120, is can be positioned in one of the fins 102 of the bottom segment 100 and connected to the speaker drivers 30,32 with a wire 39 (although not specifically shown or discussed, the wiring of the speaker drivers is generally known in the art).

In summary, the present invention furnishes a loudspeaker 10 that provides an omni-directional radiation pattern, especially with low frequencies, that decreases or eliminates the creation of dead and hot spots when broadcasting in large open or enclosed areas. The present invention also provides a loudspeaker 10 that utilizes the rear sound waves created by its speaker drivers 30,32, and a loudspeaker that has a rigid, durable yet light-weight cabinet 20 which can be hung from above and support weight hung below.

Although the invention has been described with reference to a particular arrangement of parts, features and the like, these are not intended to exhaust all possible arrangements or features, and indeed many other modifications and variations will be ascertainable to those of skill in the art.

What is claimed is:

1. A loudspeaker comprising a spherical cabinet, an annular plate dividing the cabinet into a major sound chamber and a minor sound chamber, and at least one speaker driver mounted on the annular plate, the cabinet including at least two sound propagation ports communicating with the major sound chamber and at least two sound propagation ports communicating with the minor sound chamber.

2. A loudspeaker according to claim I wherein the ratio of the volume of the major sound chamber to the volume of the minor sound chamber is between about 2:1 to about 4:1.

3. A loudspeaker according to claim 1 wherein the ratio of the volume of the major sound chamber to the volume of the minor sound chamber is between about 2.6:1 to about 3.5:1.

4. A loudspeaker according to claim 1 wherein the at least one speaker driver comprises two speaker drivers facing each other and connected out of electronic phase so as to operate as a single push-pull unit, with one of the speaker drivers extending into the minor sound chamber and the other of the speaker drivers extending into the major sound chamber.

5. A loudspeaker according to claim 1 wherein each of the at least two sound propagation ports communicating with the major sound chamber has a diameter of between about 15.5% and about 22.5% of a diameter of the cabinet.

6. A loudspeaker according to claim 5 wherein each of the at least two sound propagation ports communicating with the major sound chamber includes a tuned port tube extending into the major sound chamber a distance which is equal to between about 80% and about 120% of a diameter of said port.

7. A loudspeaker according to claim 1 wherein the sound propagation ports communicating with the minor sound chamber comprises from about 1.5 to about 3 times the number of sound propagation ports communicating with the major sound chamber.

8. A loudspeaker according to claim 1 wherein each of the at least two sound propagation ports communicating with the minor sound chamber has a diameter about 8% to about 15% of a diameter of the cabinet.

9. A loudspeaker according to claim 8 wherein each of the at least two sound propagation ports communicating with the minor sound chamber includes a tuned port tube extending into the minor sound chamber a distance which is equal to between about 25% and about 70% of a diameter of said port.

10. A loudspeaker according to claim 1 further comprising at least one support assembly extending through the cabinet and linking opposing hanging points on the outside of the cabinet.

11. A loudspeaker comprising:

a spherical cabinet including, an annular plate dividing the cabinet into a major sound chamber and a minor sound chamber, at least two sound propagation ports communicating with the major sound chamber, with each port having tuned port tubes extending into the major sound chamber, at least two sound propagation ports communicating with the minor sound chamber, with each of said ports having tuned port tubes extending into the minor sound chamber; and two speaker drivers facing each other and connected out of electronic phase to act as a push-pull unit, the push-pull unit mounted on the annular plate so that one of the speaker drivers extends into the major sound chamber and the other speaker driver extends into the minor sound chamber.

12. A loudspeaker according to claim 11 further comprising at least one support assembly extending through the cabinet and linking opposing hanging points on the outside of the cabinet.

13. A loudspeaker according to claim 11 wherein the ratio of the volume of the major sound chamber to the volume of the minor sound chamber is between about 2:1 to about 4:1.

14. A loudspeaker according to claim 11 wherein the ratio of the volume of the major sound chamber to the volume of the minor sound chamber is between about 2.6:1 to about 3.5:1.

15. A loudspeaker according to claim 11 wherein each of the at least two sound propagation ports communicating with the major sound chamber has a diameter of between about 15.5% and about 22.5% of a diameter of the cabinet.

16. A loudspeaker according to claim 11 wherein the sound propagation ports communicating with the minor sound chamber comprises from about 1.5 to about 3 times the number of sound propagation ports communicating with the major sound chamber.

17. A loudspeaker according to claim 11 wherein each of the at least two sound propagation ports communicating with the minor sound chamber has a diameter about 8% to about 15% of a diameter of the cabinet.

18. A loudspeaker comprising:

a rigid, spherical cabinet;

an annular plate dividing the cabinet into two sound chambers, each of the two sound chambers having at least two sound propagation ports communicating therewith;

two speaker drivers connected out of electronic phase and mounted on the annular plate so that one of the speaker drivers is at least substantially contained in one of the sound chambers and the other speaker driver is at least substantially contained in the other of the sound chamber; and at least one support assembly extending through the cabinet and linking opposing hanging points on the outside of the cabinet.

19. A loudspeaker according to claim 18 wherein each of the at least two sound propagation ports communicating with each sound chamber includes a tuned port tube extending into the sound chamber.

* * * * *